(12) United States Patent
Hostutler et al.

(10) Patent No.: US 11,920,235 B2
(45) Date of Patent: Mar. 5, 2024

(54) ELEMENTAL ALKALI-METAL DISPENSER

(71) Applicants: Utah State University Space Dynamics Laboratory, North Logan, UT (US); A-Tech Corp, Albuquerque, NM (US); The Government of the United States of America as Represented by the Secretary of the Air Force, Kirtland AFB, NM (US)

(72) Inventors: David Hostutler, Albuquerque, NM (US); Matthew Bigelow, Albuquerque, NM (US); Rudolph N. Kohn, Jr., Rio Rancho, NM (US); Spencer Olson, Tijeras, NM (US); Matthew Squires, Kirtland AFB, NM (US); Daniel R. Blakley, Kaysville, UT (US); Eric Imhof, Calabasas, CA (US); Brian Kasch, Albuquerque, NM (US); Mary Spanjers, Springboro, OH (US)

( * ) Notice: Subject to any disclaimer, the term of this patent is extended or adjusted under 35 U.S.C. 154(b) by 1004 days.

(21) Appl. No.: 16/700,872

(22) Filed: Dec. 2, 2019

(65) Prior Publication Data

US 2020/0102639 A1 Apr. 2, 2020

Related U.S. Application Data

(62) Division of application No. 15/867,308, filed on Jan. 10, 2018, now Pat. No. 10,519,537.

(51) Int. Cl.
*C23C 14/14* (2006.01)
*C01B 32/156* (2017.01)
*C01B 32/20* (2017.01)
*C01B 32/215* (2017.01)
*C01D 17/00* (2006.01)
*C22B 26/00* (2006.01)
*C22B 26/10* (2006.01)
*C22F 1/02* (2006.01)
*C23C 14/26* (2006.01)

(52) U.S. Cl.
CPC ............ *C23C 14/14* (2013.01); *C01B 32/156* (2017.08); *C01B 32/20* (2017.08); *C01B 32/215* (2017.08); *C01D 17/00* (2013.01); *C22B 26/00* (2013.01); *C22B 26/10* (2013.01); *C22F 1/02* (2013.01); *C23C 14/26* (2013.01)

(58) Field of Classification Search
None
See application file for complete search history.

(56) References Cited

U.S. PATENT DOCUMENTS 4,608,192 A    8/1986  Su

FOREIGN PATENT DOCUMENTS

EP    0130803 A2    1/1985

OTHER PUBLICATIONS

Aronson et al.; Thermodynamic Properties of Rubidium-Graphite Lamellar Compounds; The Journal of Chemical Physics; 45, 4551-4555; 1966.*

(Continued)

*Primary Examiner* — Guinever S Gregorio

(57) ABSTRACT

An alkali-metal dispenser to dispense highly pure rubidium in a high-vacuum environment while not negatively impacting the high-vacuum pressure level. The alkali-metal dispenser is operable in various vapor-deposition applications or to provide a highly pure elemental-alkali metal in cold-atom magneto-optical traps.

17 Claims, 9 Drawing Sheets

(56) References Cited

OTHER PUBLICATIONS

Solin et al.; Raman Scattering from Intercalated Donor Compounds of Graphite; Physical Review B; 16, No. 6, pp. 2965-2972; 1977.*
Semenenko et al. ; Synthetic Metals; 40, 267-273; 1991.*
Saes Group, Alkali Metal Dispenser, https://www.saesgetters.com/products-functions/products/dispensers/alkali-metals-dispensers, Sep. 20, 2017.
Akuzawa et al., Decomposition of rubidium- and cesium-graphite intercalation compounds in oxygen atmosphere, 24:3 Carbon 295-299 (1986).
Asher et al., A lamellar compound of sodium and graphite, 10 J. Inorg. Nucl. Chem 238-249 (1959).
Caballero et al., Adsorption and oxidation of K deposited on graphite, 365 Surface Science 253-265 (1996).
Ichimura et al., Gettering of hydrogen and oxygen by alkali-metal graphite intercalation compounds, 10:3 Journal of Vacuum Science 543-546 (1992).
Aronson et al., Thermodynamic properties of the potassium-graphite lamellar compounds from solid-state emf measurements, 49:1 The Journal of Chemical Physics 434-439 (1968).
Salzano et al., Thermodynamic properties of rubidium-graphite lamellar compounds, 45:12 The Journal of Chemical Physics 4551-4555 (1966).
Salzano et al., Erratum: Thermodynamic properties of rubidium-graphite lamellar compounds, 46 The Journal of Chemical Physics 4169 (1967).
Wolfe et al., Diffusion of nonvolatile metallic elements in graphite, 36:6 Journal of Applied Physics 1906-1917 (1965).
Levi et al., Systematic shift uncertainty evaluation of Ien CSF1 primary frequency standard, 52:2 IEEE Transactions on Instrumentation and Measurement 267-271 (2003).
Sebby-Strabley et al., Design innovations towards miniaturized GPS-quality clocks, IEEE Xplore Digital Library (May 9-12, 2016).
Nixon et al., Formation and structure of the potassium graphites, 1:3 Journal of Physics D: Applied Physics 291-299 (1968).
Rudorff et al., Graphite intercalation compounds, 1 Advances in Inorganic Chemistry and Radiochemistry 223-266 (1959).
Dzurus et al., Graphite Compounds, 79 Contribution from the Department of Chemistry, Argonne National Laboratory 1051-1054 (1956).
Jungblut et al., Diffusion of lithium in highly oriented pyrolytic graphite at low concentrations and high temperatures, 40:16 Physical Review B 10810-10815 (1989).
Purewal et al., Hydrogen adsorption by alkali metal graphite intercalation compounds, California Institute of Technology 1-212 (2010).
Jefferts et al., Accuracy evaluation of NIST-F1, 39 Metrologia 321-336 (2002).
Szymaniec et al., First accuracy evaluation of the NPL)CsF2 primary frequency standard, 47 Metrologia 363-376 (2010).
Solin et. al., Raman Scattering From Alkali Graphite Intercalation Compounds, 1981, Journal of Raman Spectroscopy, vol. 10, p. 129-135, 1981.
Jungblut et. al., Diffusion of Lithium in Highly Oriented Pyrolytic Graphite at Low Concentrations and High Temperature, 1989, Physical Review B, vol. 40, No. 16, p. 10810-10815, 1989.
Hohn et al., Clean, robust alkali sources by intercalation within highly oriented pyrolytic graphite, Review of Scientific Instruments, Mar. 9, 2020, 91, 035108.

* cited by examiner

US 11,920,235 B2

ELEMENTAL ALKALI-METAL DISPENSER

RELATED APPLICATIONS

This application is a division of U.S. patent application Ser. No. 15/867,308, filed on 10 Jan. 2018 and entitled ELEMENTAL ALKALI-METAL DISPENSER, pending, the disclosure of which is incorporated in its entirety by this reference.

GOVERNMENT SPONSORED RESEARCH

This invention was made with government support under contract HQ0147-11-D-0052 and FA9453-16-D-0004, both awarded by the Air Force Research Laboratory. The government has certain rights in the invention.

TECHNICAL FIELD

The present disclosure relates to methods for making and using elemental-alkali metal dispensers, more particularly, to novel systems and methods for making and using rubidium alkali metal dispensers.

BACKGROUND

Alkali metal dispensers are used to dispense rubidium or other alkali metals in cold-atom experiments.

SUMMARY

Applicants have identified the need for an alkali-metal dispenser capable of dispensing highly pure rubidium in a high-vacuum environment while not negatively impacting the high-vacuum pressure level. An alkali-metal dispenser may be used in various vapor-deposition applications or to provide a highly pure elemental-alkali metal in cold-atom magneto-optical traps.

The present disclosure in aspects and embodiments addresses these various needs and problems.

BRIEF DESCRIPTION OF THE DRAWINGS

The foregoing features of the present invention will become more fully apparent from the following description and appended claims, taken in conjunction with the accompanying drawings. Understanding that these drawings depict only typical embodiments of the invention and are, therefore, not to be considered limiting of its scope, the invention will be described with additional specificity and detail through use of the accompanying drawings in which:

DETAILED DESCRIPTION

Figure 1:
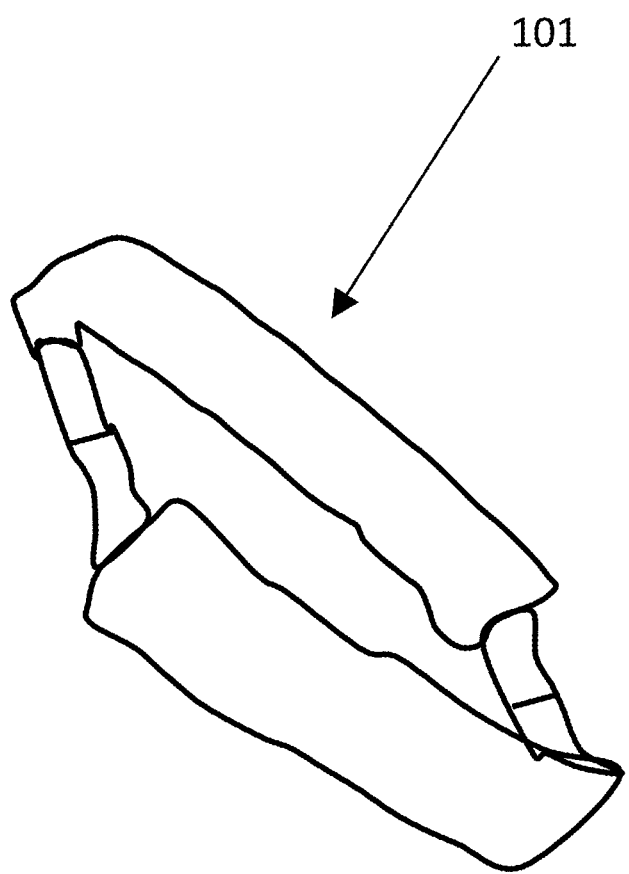
FIG. 1 is an illustration of a pair of rubidium-chromate dispensers modified for high-vacuum, cold-atom experiments.

The present disclosure covers apparatuses and associated methods for making and using an elemental alkali-metal dispenser. In the following description, numerous specific details are provided for a thorough understanding of specific preferred embodiments. However, embodiments can be practiced without one or more of the specific details, or with other methods, components, materials, etc. In some cases, well-known structures, materials, or operations are not shown or described in detail in order to avoid obscuring aspects of the preferred embodiments. Furthermore, the described features, structures, or characteristics may be combined in any suitable manner in a variety of alternative embodiments. Thus, the following more detailed description of the embodiments of the present invention, as illustrated in some aspects in the drawings, is not intended to limit the scope of the invention, but is merely representative of the various embodiments of the invention.

In this specification and the claims that follow, singular forms such as "a," "an," and "the" include plural forms unless the content clearly dictates otherwise. All ranges disclosed herein include, unless specifically indicated, all endpoints and intermediate values. In addition, "optional" or "optionally" or "or" refer, for example, to instances in which subsequently described circumstance may or may not occur, and include instances in which the circumstance occurs and instances in which the circumstance does not occur. The terms "one or more" and "at least one" refer, for example, to instances in which one of the subsequently described circumstances occurs, and to instances in which more than one of the subsequently described circumstances occurs.

FIG. 1 is a schematic illustration of a pair of rubidium-chromate dispensers modified for high-vacuum, cold-atom experiments. In this arrangement, two commercially available rubidium-chromate dispensers have been spot-welded together to make an electrically conductive loop capable of being inductively heated in a high-vacuum environment.

The inventors of the present disclosure found that commercially available rubidium-chromate dispensers provided a limited amount of rubidium that was necessary for the inventors' cold-atom experiments. Additionally, the inventors identified that commercially available rubidium-chromate dispensers also had other functional drawbacks that limited their effective use in high-vacuum environments. As such, the inventors began looking at other potential sources for providing a high-purity elemental rubidium, or other alkali metals, that could be used in a high-vacuum environment.

Figure 2:
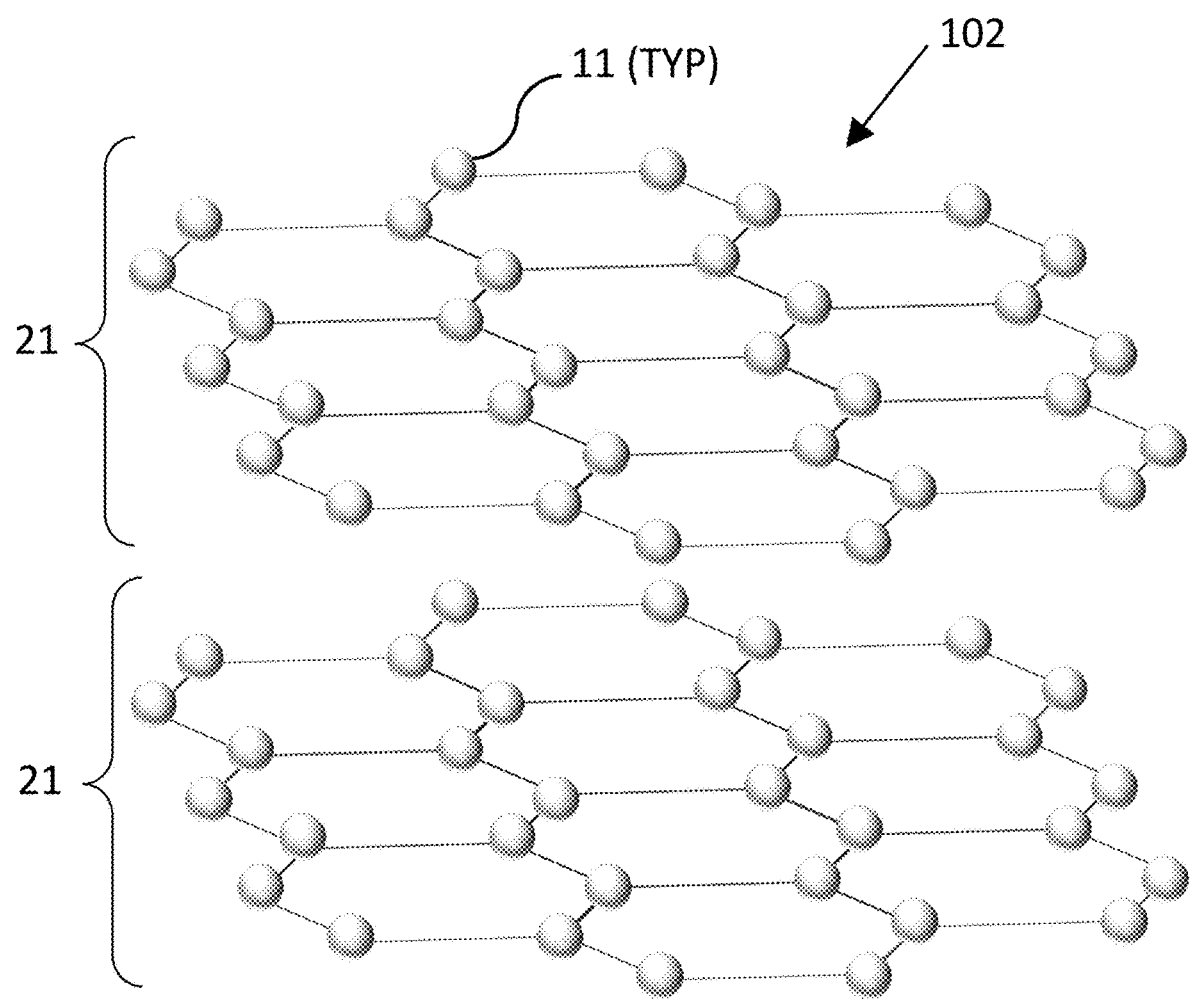
FIG. 2 is an isometric view of an atomic structure of highly oriented pyrolytic graphite ("HOPG")

FIG. 2 illustrates an isometric view of an atomic structure of highly-oriented pyrolytic graphite volume 102 ("HOPG"). HOPG is a highly pure and ordered form of synthetic graphite. In this illustration, elemental carbon 11 is organized into a hexagonal ring. The rings are in columnar layers or grains 21. The term "mosaic spread angle" is related to the angle of deviation of a grain boundary from the perpendicular axis of the columnar structure. A lower spread angle indicates a more highly ordered and higher quality HOPG. HOPG is available commercially under different grades or qualities. For example, one manufacturer advertises three HOPG grades: ZYA with a mosaic spread angle of about 0.4°±0.1°; ZYB with a mosaic spread angle of about 0.8°±0.2°; and ZYC with a mosaic spread angle of about 3.5°±1.5°.

Figure 3:
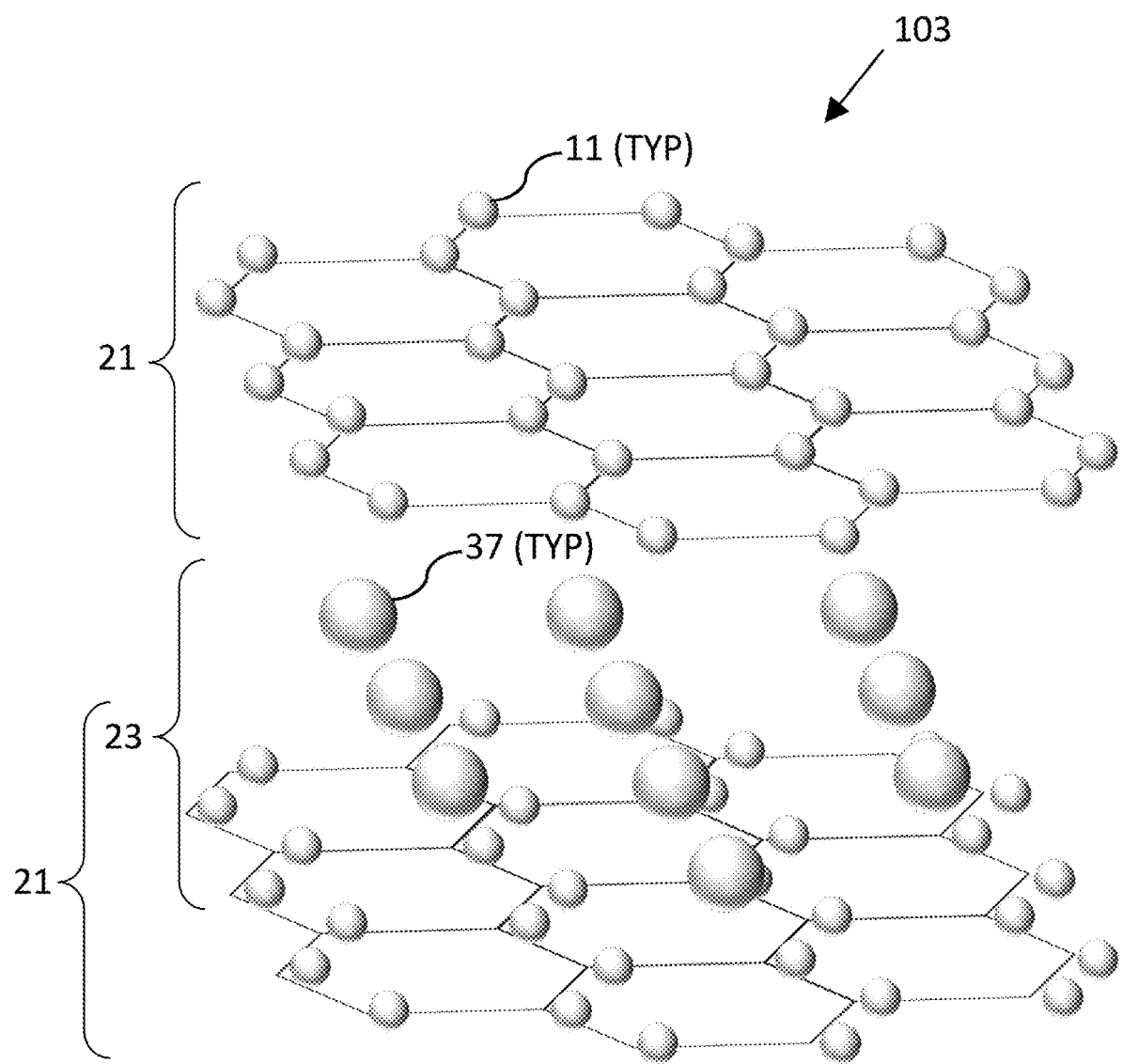
FIG. 3 is an isometric view of an atomic structure of HOPG intercalated with an alkali metal.

HOPG may be intercalated with an alkali metal. FIG. 3 illustrates an isometric view of a rubidium-intercalated HOPG 103 or an HOPG-alkali metal volume 103. In this illustration, rubidium 37 is dispersed as a rubidium layer 23 between the carbon layers or grains 21.

Figure 4A:
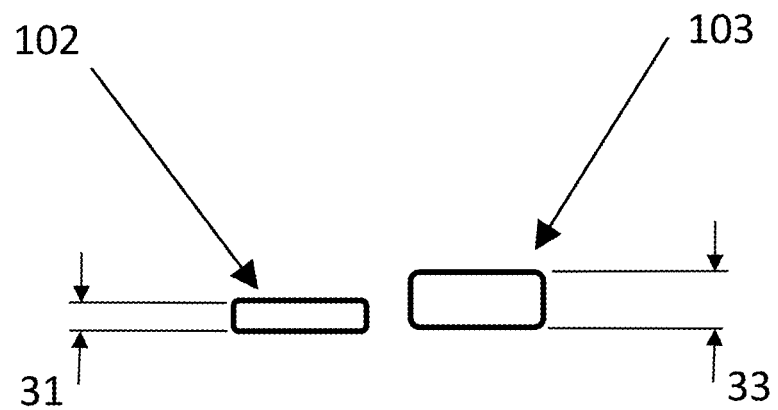
FIGS. 4A and 4B are illustrations of example HOPG volumes with and without being intercalated with an alkali metal, respectively.
Figure 4B:
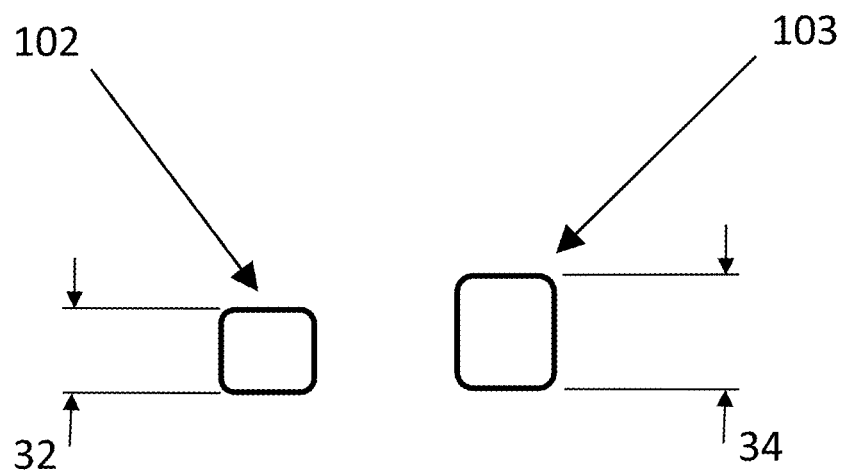

When intercalated with an alkali metal such as rubidium, an HOPG increases in volume. FIGS. 4A and 4B are schematic illustrations comparing a side view (FIG. 4A) and a top view (FIG. 4B) of an "empty" HOPG 102 and an HOPG-alkali metal volume 103. Empty HOPG 102 has an initial width 31 and depth 32. HOPG-alkali metal volume 103 has a larger width 33 and larger depth 34. The difference in volume between the HOPG 102 and the HOPG-alkali metal volume 103 is the difference in the amount of rubidium 37 intercalated into the HOPG-alkali metal volume 103. In these photograph illustrations, the volume of HOPG-alkali metal volume 103 is at least about 25% greater than HOPG 102. The inventors of the present disclosure found that an about 25% increase in size of a common, commercially available HOPG correlated to a lower threshold of a useful amount of Rubidium that might be available for cold-atom experiments.

Alkali metals are very reactive and oxidize quickly in air, making them difficult to handle and use in experiments. Alkali metals do not cease to be reactive even after being loaded or intercalated into an empty HOPG, such as HOPG 102. For example, in an air environment, a rubidium-intercalated HOPG 103 will quickly oxidize and self-destruct if left in an oxygen-rich environment, such as on a lab bench. The inventors of the present disclosure found that they could further process an HOPG-alkali metal volume 103 such that it was much less reactive in air. This allowed the inventors to more easily handle and use the HOPG-alkali metal volume 103 in experiments.

Figure 5:
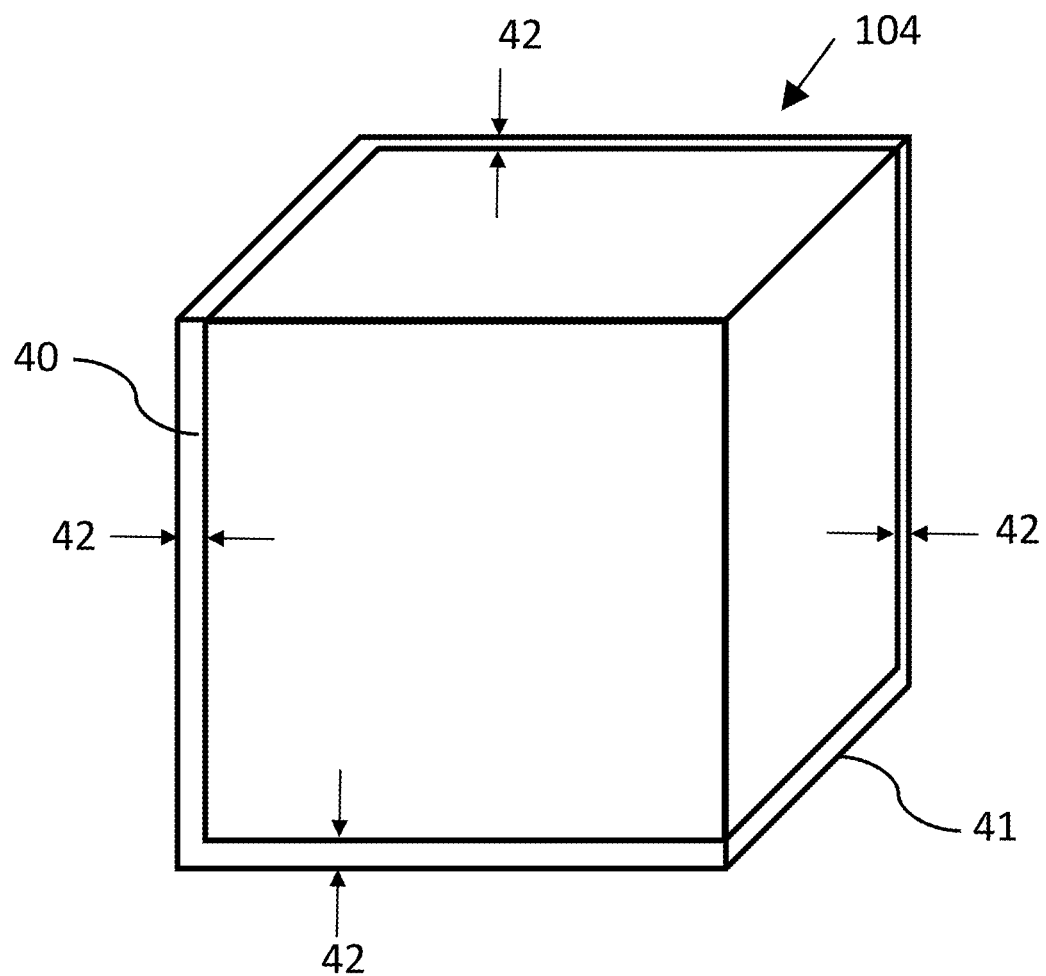
FIG. 5 is a schematic depiction of an HOPG volume intercalated with an alkali metal wherein the outer-most layer of the HOPG volume is substantially free of an elemental-alkali metal.

FIG. 5 is a schematic illustration of another HOPG-alkali metal volume 104. HOPG-alkali metal volume 104 has a rubidium-intercalated inner volume 40 and a rubidium-free (or substantially free) outer volume 41. The difference in volume between the rubidium-intercalated inner volume 40 and the rubidium-free outer volume 41 is the rubidium-free thickness 42. In practice, the inventors of the present disclosure found that thickness 42 was somewhat uniform around the inner volume 40. An HOPG-alkali metal volume 104 with a deeper rubidium-free thickness 42 is less reactive in air and easier to use. However, a deeper rubidium-free thickness 42 provides less rubidium in the HOPG-alkali metal volume 104 that might otherwise be available for experimental use. Thus, there is a balance between the deeper thickness 42 with a more stable or less reactive HOPG volume, and a shallower thickness 42 with more alkali metal available for experimental use. In embodiments, thickness 42 may be in the range of about 10 microns to about 1000 microns, and more particularly in the range of about 100 microns to about 500 microns. In embodiments, thickness 42 may be at least 100 microns, but may vary depending on the dimensions of the HOPG 102. The thickness 42 is typically less that a maximum width, thickness and/or length of the HOPG 102.

The inventors of the present disclosure discovered various methods for making an alkali-metal dispenser like HOPG-alkali metal volume 104. The HOPG-alkali metal volume 104 was less reactive in air and easier to use. The following examples are illustrative only and are not intended to limit the disclosure in any way.

EXAMPLES

Method for Making an Alkali-Metal Dispenser

Figure 6:
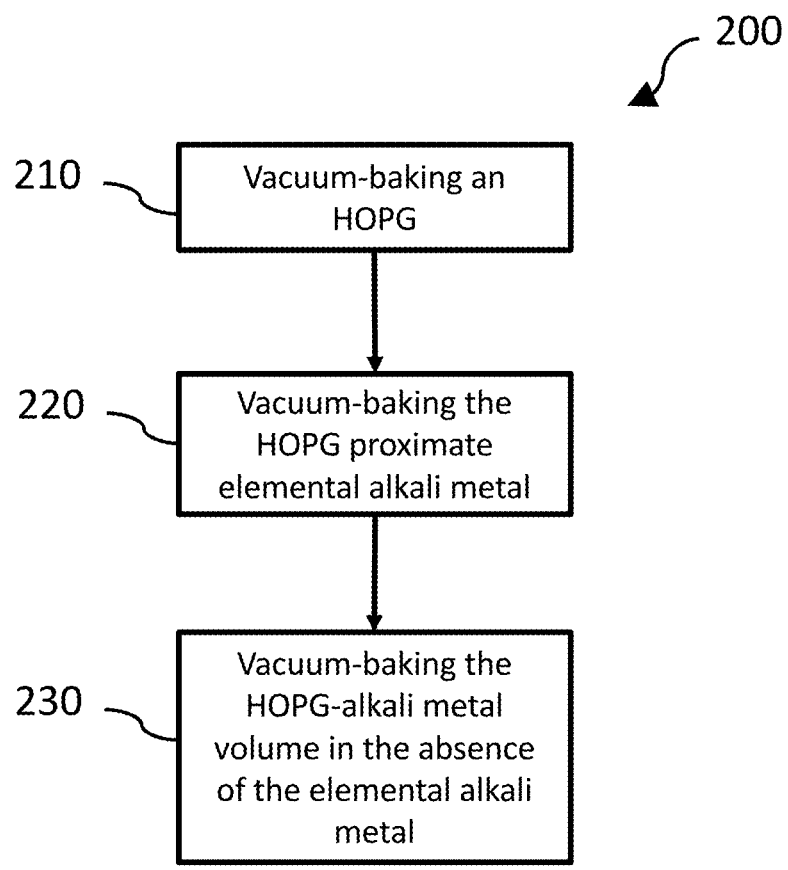
FIG. 6 is a flow diagram showing an example method for making an alkali-metal dispenser.

FIG. 6 illustrates a method for making an alkali-metal dispenser. In embodiments, a method for making an alkali-metal dispenser includes vacuum-baking a highly oriented pyrolytic graphite ("HOPG") volume 210. A high-quality HOPG volume, or an HOPG volume with a low mosaic spread angle, performs better at intercalating alkali metal than a low-quality HOPG volume. Through experimentation, the inventors of the present disclosure found that the lower the mosaic spread angle of the HOPG volume, the better the HOPG volume performed at intercalating an alkali metal. In embodiments, the HOPG volume may have a mosaic spread angle less than about 1.2 degrees.

A commercially available HOPG volume may contain oxygen, water, or other impurities that may be trapped between the elemental carbon layers or grains and could have been introduced into the HOPG volume simply through shipping or handling. The impurities may chemically react with an alkali metal that is later intercalated into the HOPG volume and thus reduce the life or use of an alkali metal dispenser. Vacuum-baking the HOPG volume should occur a high enough temperature, a low enough vacuum, and a sufficient amount of time to remove the oxygen, water, or other impurities that may be in the HOPG volume. In embodiments, an HOPG volume may be vacuum baked at a temperature greater than about 200 degrees C. while exposed to a vacuum that is less than about $1\times10^{-5}$ Torr, for a time period longer than about 48 hours. The inventors of the present disclosure found that these conditions provided a sufficiently "pure" HOPG that could then absorb an alkali metal without reacting with it.

After vacuum-baking the HOPG volume, the method for making the alkali-metal dispenser further includes vacuum-baking the HOPG volume while proximate an elemental-alkali metal until the HOPG volume has increased in size 220. In embodiments, "proximate an elemental-alkali metal" means the HOPG is surrounded by a pool of melted elemental-alkali metal (e.g., sitting in or positioned adjacent to a pool of melted elemental-alkali metal), or means the HOPG is completely submerged in a bath of melted elemental-alkali metal, or means the HOPG is positioned adjacent to (i.e., touch or spaced apart form) an elemental-alkali metal in a solid state. In embodiments, the elemental-alkali metal may be elemental Caesium (or Cesium) ("Cs"), Rubidium ("Rb"), or Potassium ("K").

Once loaded or intercalated with the elemental-alkali metal, the HOPG volume has become an HOPG-alkali metal volume (shown as HOPG-alkali metal volume 103 in FIG. 3). In experiments, the inventors of the present disclosure loaded an about 7×7×1 mm³ HOPG, with an initial mass of about 110 milligrams, with additional Rb between about 100 mg and about 220 mg.

As the alkali metal intercalates into the HOPG volume, the HOPG volume increases in size. The increase in size correlates to the amount of alkali metal intercalated into the HOPG-alkali metal volume. Generally, the longer the time that the HOPG volume is vacuum-baked while proximate the alkali metal at ideal conditions, the greater the increase in size and the greater the amount of alkali metal that is available for experimentation. In experiments, the inventors of the present disclosure found that a HOPG, when fully intercalated with Rb, can increase in volume between about 200% to about 300%. The inventors further found that, using a commercially available about 7×7×1 mm$^3$ HOPG, an about 25% increase in volume represented a minimum useful amount of alkali metal after the HOPG-alkali metal volume 103 is further processed, as described herein.

An HOPG volume may also be loaded or intercalated with an alkali metal to a pre-determined alkali-metal density. For example, in embodiments, an HOPG may be intercalated with Rb with an average Rb density greater than about 0.25 mg Rb/mm$^3$. The inventors of the present disclosure found that an Rb density greater than about 0.25 mg/mm$^3$ provided sufficient Rb within the alkali-metal dispenser for later experiments.

Figure 7:
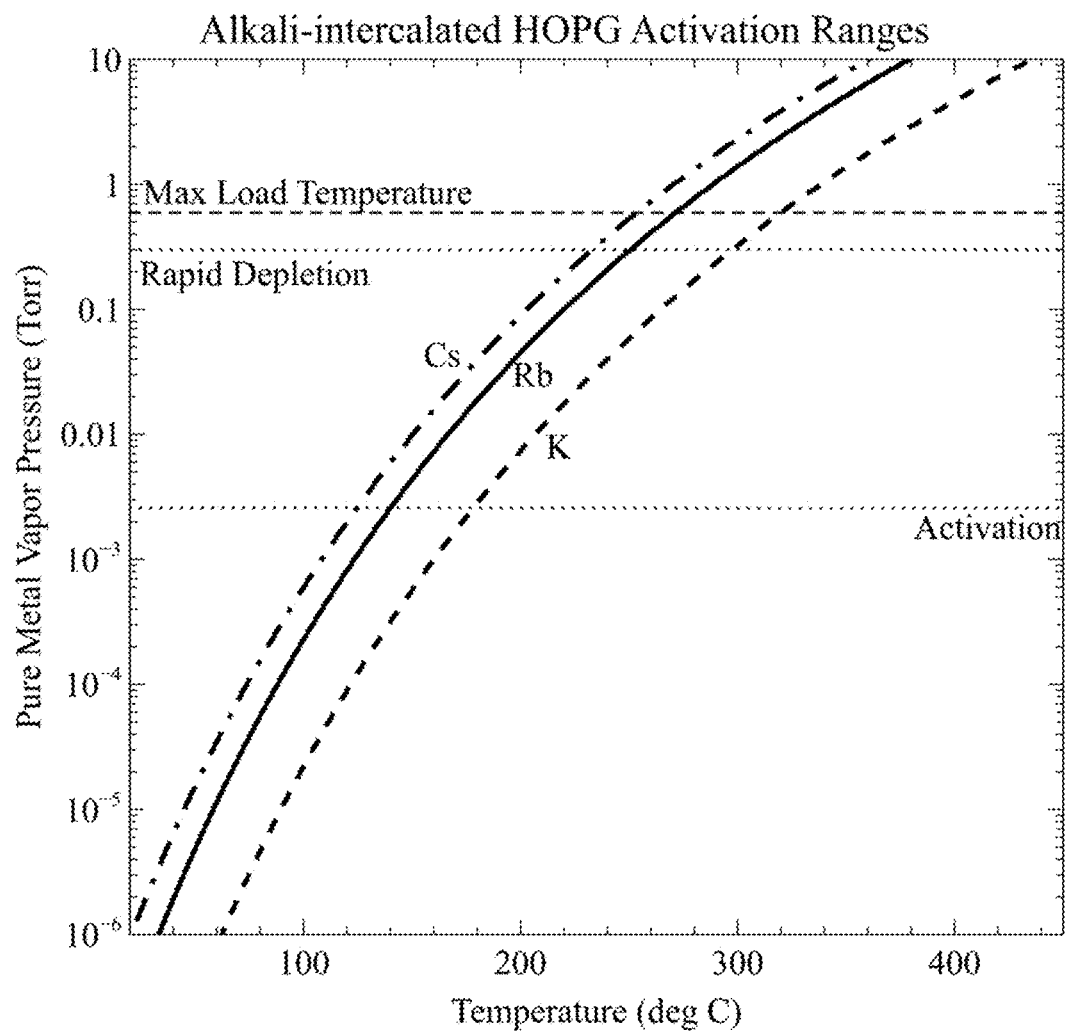
FIG. 7 illustrates vapor pressure measurements for elemental Caesium (or Cesium) ("Cs"), Rubidium ("Rb"), and Potassium ("K") as a function of temperature and pressure.

The temperature and vacuum level at which the HOPG volume is vacuum-baked while proximate the alkali metal can also be significant. FIG. 7 illustrates the vapor pressure of three alkali metals: Caesium (or Cesium) ("Cs"), Rubidium ("Rb"), and Potassium ("K"), as a function of pressure and temperature. FIG. 7 also illustrates three horizontal lines: Activation, Rapid Depletion, and Max Load Temperature. The intersection of the Activation line with each of the three alkali metals' vapor pressure line indicates the activation temperature. That temperature also correlates to an HOPG loading temperature for that metal.

For example, in experiments, and in embodiments of the present disclosure, the inventors of the present disclosure found that they could load an HOPG with Rb at a temperature greater than about 125 degrees C. and a pressure less than about $1 \times 10^{-3}$ Torr. The inventors further found that using a vacuum pressure that is less than about $1 \times 10^{-3}$ Torr was sufficient to pump away excess gasses or water vapor that could react with the HOPG volume or alkali metal in the HOPG volume. For example, in one failed experiment, where the vacuum level was slightly higher than about $1 \times 10^{-3}$ Torr due to a small vacuum leak, the HOPG could not be successfully loaded with the elemental-alkali metal.

It is also understood that a sufficient amount of vacuum baking time allows the alkali metal to intercalate towards the center of the HOPG-alkali metal volume. Alkali metal in the center of the HOPG-alkali metal volume is less likely to react with air or water and destroy the alkali-metal dispenser because it is more difficult for air or water to infiltrate into the center of the HOPG volume when the alkali-metal dispenser is removed from the vacuum environment and placed in air. In contrast, alkali metal in the outer layers of the HOPG-alkali metal volume is more likely to react with air or water and destroy the alkali-metal dispenser because it is more exposed to air or water. It is therefore preferable to have the alkali metal towards or at the center, rather than within the outer layers of the HOPG-alkali metal volume. In practice, the inventors of the present disclosure found that vacuum baking the HOPG in the presence of the alkali metal more than about 24 hours allowed the alkali metal to intercalate towards the center of the HOPG volume. Alternatively, vacuum baking the HOPG in the presence of the alkali metal up to 72 hours ensured complete intercalation of an about 7×7×1 mm$^3$ HOPG.

Through experimentation, the inventors of the present disclosure found that vacuum-baking the HOPG volume while proximate an elemental-alkali metal until the HOPG volume increased in size by about 25% provided sufficient alkali metal as an alkali-metal dispenser in future experiments. An about 25% size increase also ensured a minimum amount of alkali metal was still available after the next step described hereafter where some of the alkali metal is removed from the HOPG-alkali metal volume.

Through experiments, the inventors of the present disclosure observed that an alkali-metal free layer on the outside of the alkali-metal dispenser prevents (or delays) the alkali-metal dispenser, or the alkali metal within the alkali-metal dispenser, from reacting with air and water when the alkali-metal dispenser was removed from a vacuum environment and exposed to air. It is understood that, once exposed to air, air and water vapor begin entering into the outer-most layers of the HOPG volume. If alkali metal is present in those layers, the alkali metal can oxidize quickly. The resulting exothermic chemical formation of RbOH heats the HOPG-alkali metal volume, damages the structural integrity of the HOPG volume, and depletes the useful alkali metal available for future experiments. Thus, the inventors of the present disclosure observed that it is necessary to remove alkali metal from the outer-most layer of the alkali-metal dispenser to provide a "shelf stable" or less reactive alkali-metal dispenser.

After vacuum-baking the HOPG volume while proximate an elemental-alkali metal (such that the HOPG volume becomes an HOPG-alkali metal volume), the method for making the alkali-metal dispenser further includes vacuum-baking the HOPG-alkali metal volume in the absence of the elemental-alkali metal until an outer-most layer of the HOPG-alkali metal volume is substantially free of the elemental-alkali metal 230 (as shown in FIG. 6). In general, vacuum-baking the HOPG-alkali metal volume in the absence of the elemental-alkali metal for longer periods, at higher temperatures, and at lower vacuum pressures, removes a greater amount of alkali metal. The inventors of the present disclosure observed that in this step the alkali metal is removed from the HOPG-alkali metal volume starting from the surface and outer-most layer and working towards the center of the HOPG-alkali metal volume.

The inventors of the present disclosure performed multiple experiments to determine how much elemental-alkali metal needed to be removed from the HOPG-alkali metal volume to provide a "shelf stable" or less reactive alkali-metal dispenser. The more alkali metal removed, the more stable the alkali metal dispenser, but also the less alkali metal is available (and useful) for future experiments. The inventors observed that it is possible to remove a pre-determined amount of alkali metal as measure by weight, or, alternatively, to remove a pre-determined amount of alkali metal as a measure of the thickness of an alkali-metal free layer.

In one experiment, the HOPG-alkali metal volume was not additionally vacuum-baked in the absence of the alkali metal. In this experiment, after being removed from the vacuum environment, the HOPG-alkali metal volume turned gray, fizzled, and popped, until an RbOH compound formed on the HOPG volume that was air-stable. The resulting HOPG-alkali metal volume was difficult to handle and performed very poorly as an alkali metal dispenser. For example, the HOPG-alkali metal volume was not able to provide a highly pure alkali metal in a high-temperature, high-vacuum environment without significantly outgassing other impurities such as oxygen and hydrogen.

In another experiment, the inventors of the present disclosure vacuum-baked the HOPG-alkali metal volume in the absence of the elemental-alkali metal, but did not do so until the outer-most layer of the HOPG-alkali metal volume was substantially free of the elemental-alkali metal. When removed from the vacuum environment, the resulting HOPG-alkali metal volume did not react as violently in air but it did still turn gray, which again indicated the formation of RbOH. The resulting HOPG-alkali metal volume performed poorly as an alkali-metal dispenser because it out-gassed impurities and less alkali metal was available for future experimentation.

In another experiment, the inventors vacuum-baked the HOPG-alkali metal volume in the absence of the elemental-alkali metal until about 5% (by weight) of the alkali metal was removed from the HOPG-alkali metal volume. In this experiment, the outer-most layer of the HOPG-alkali metal volume became substantially free of the elemental-alkali metal. When exposed to air, the HOPG-alkali metal volume retained a glossy black sheen, or the original color and sheen of an HOPG that does not contain a highly reactive alkali metal. The inventors were able to place the resulting alkali-metal dispenser in an air environment for longer than about 90 minutes with no visible changes to the alkali-metal dispenser.

It is also possible to vacuum-bake the HOPG-alkali metal volume in the absence of the elemental-alkali metal until a pre-determined thickness (e.g., illustrated as thickness 42 in FIG. 5) of the outer-most layer is substantially free of the alkali metal. In other embodiments of the method for making an alkali-metal dispenser, the HOPG-alkali metal volume may be vacuum-baked in the absence of the alkali metal until the outer-most layer of the HOPG-alkali metal volume that is substantially free of the elemental-alkali metal is thicker than about 100 microns. The inventors of the present disclosure estimate that an about 100 micron thickness provides a sufficient buffer to prevent or delay the alkali-metal dispenser from reacting with air until the alkali-metal dispenser can be stored in an inert-gas environment or otherwise used in future experiments. The about 100 micron elemental-alkali metal free thickness necessary for providing a shelf-stable HOPG-alkali metal volume correlates to a percentage decrease in weight as described above.

After the step of vacuum-baking the HOPG-alkali metal volume in the absence of the elemental-alkali metal, the alkali-metal dispenser may have an about 100 micron thick outer layer that is substantially free of the alkali metal. Additionally, the remaining volume may have an alkali-metal density greater than about 0.25 mg/mm$^3$. In this example, the alkali-metal dispenser contains a sufficient amount of alkali metal to be useful in future experiments and is also not reactive in an oxygen-rich environment.

In embodiments, the step of vacuum-baking the HOPG-alkali metal volume in the absence of the elemental-alkali metal occurs at a temperature greater than about 140 degrees C., while exposed to a vacuum less than about $1 \times 10^{-5}$ Torr, and for a time period longer than about 12 hours. Referring back to FIG. 7, the activation temperature of Rb is about 125 degrees C. The inventors of the present disclosure found that performance of the alkali metal dispenser improved if the HOPG-alkali metal volume was vacuum-baked (in the absence of the elemental-alkali metal Rb) at a temperature greater than about 140 degrees C., or just above the activation temperature, for a time period of 12 hours. This operational time and temperature removed between 5 and 10% of the total Rb contained in the HOPG-alkali metal volume, but did so from the outer layers of the HOPG-alkali metal volume, which the inventors found ideal for providing a sufficient amount of elemental Rb in a "shelf-stable" alkali metal dispenser.

Other steps may be added to the method for creating an alkali-metal dispenser that might make the process more efficient. For example, in embodiments, loading the HOPG volume with an alkali metal occurs by vacuum-baking the HOPG volume while proximate an elemental-alkali metal. After this step is completed, all of the elemental-alkali metal proximate the HOPG volume may not have been absorbed into the HOPG-alkali metal volume. Thus, prior to vacuum-baking the HOPG-alkali metal volume in the absence of the elemental alkali until an outer-most layer of the HOPG-alkali metal volume is substantially free of the elemental-alkali metal, it may be necessary to remove the elemental-alkali metal proximate the HOPG-alkali metal volume that has not intercalated into the HOPG-alkali metal volume.

Still in other embodiments, the method for making an alkali-metal dispenser includes, after vacuum-baking the HOPG-alkali metal volume until an outer-most layer of the HOPG-alkali metal volume is substantially free of the elemental-alkali metal, packaging the HOPG-alkali metal volume in an inert-gas environment. An inert-gas environment could be a nitrogen-purged container which would further help prevent or delay oxidation of the elemental-alkali metal in the alkali metal dispenser.

Methods for Using an Alkali-Metal Dispenser

An alkali-metal dispenser may be used to dispense a pure, elemental-alkali metal in a vacuum environment. The elemental-alkali metal may be used, for example, in cold-atom experiments. In embodiments, a method for dispensing elemental rubidium includes providing an HOPG volume intercalated with elemental rubidium ("Rb"), wherein the HOPG volume is inside a vacuum chamber at a vacuum pressure below about $1.3 \times 10^{-5}$ Torr. The method further includes heating the HOPG such that the HOPG emits the Rb at a partial pressure between about $1 \times 10^{-11}$ Torr and about $1 \times 10^{-6}$ Torr.

Figure 8:
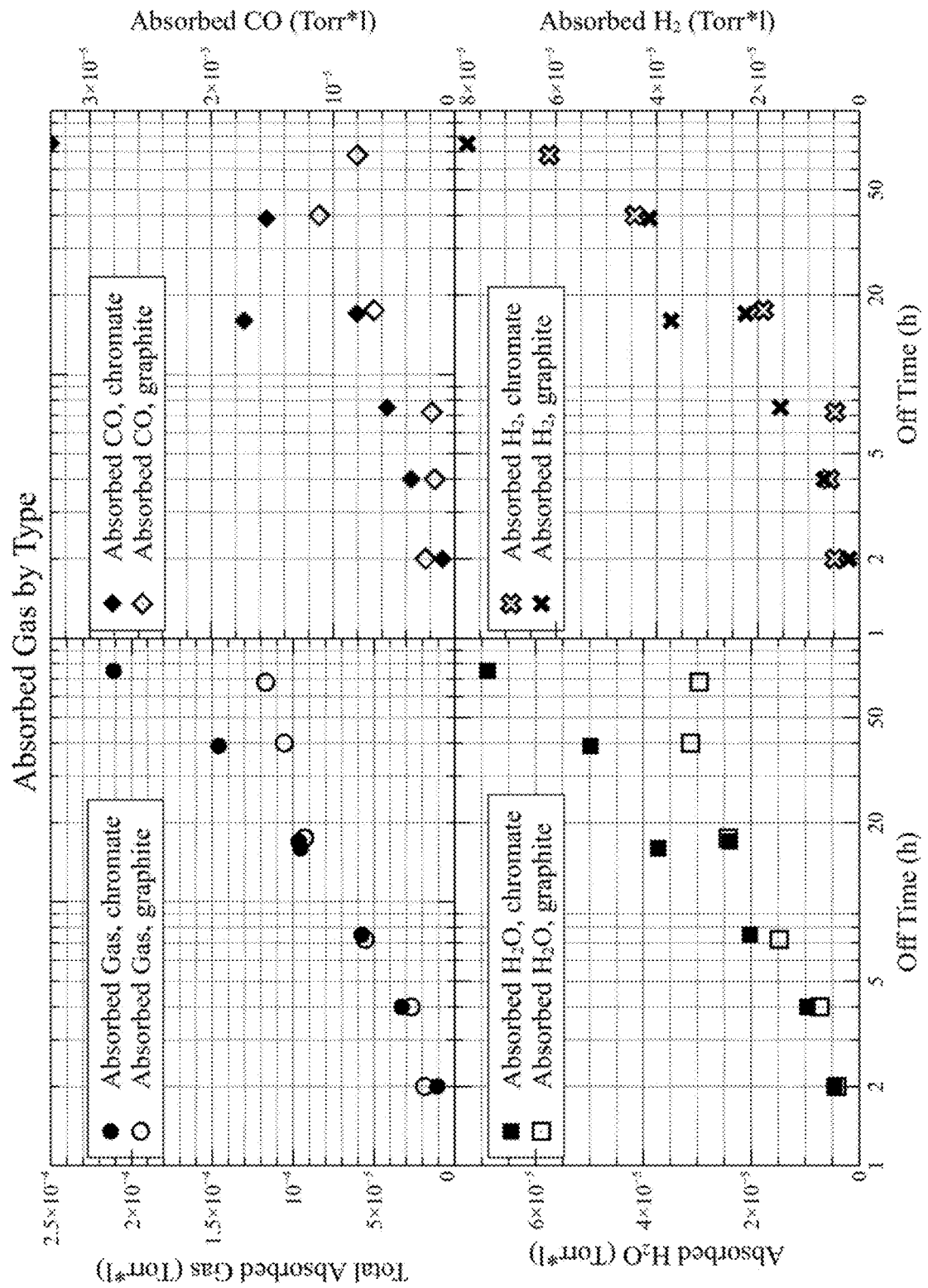
FIG. 8 is a series of graphs comparing an amount of absorbed gas released from a chromate dispenser and an HOPG dispenser after each has been re-heated in a high-vacuum environment.
Figure 9:
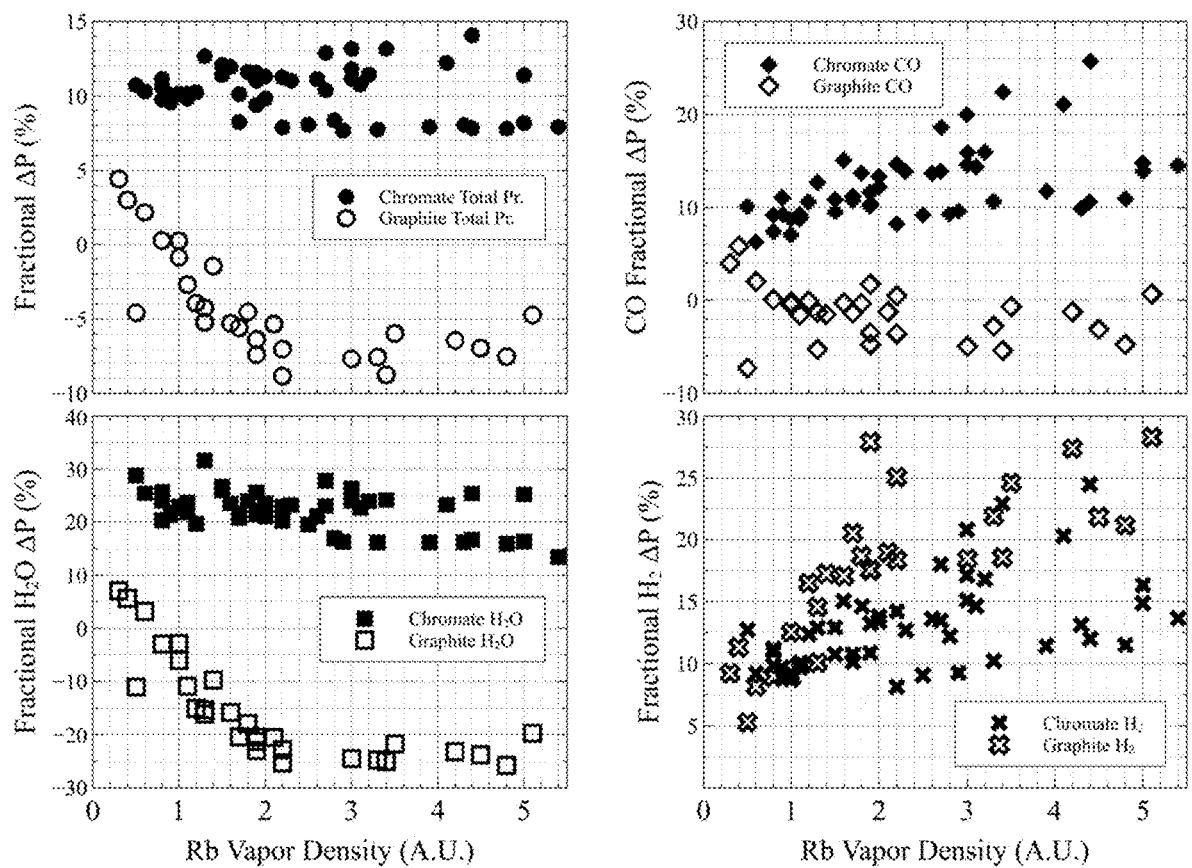
FIG. 9 is a series of graphs comparing total and partial pressures of various gasses or vapors after heating a chromate dispenser and a graphite dispenser.

An alkali-metal dispenser made using the steps described above performs better at dispensing pure, elemental-alkali metal than a commercial chromate dispenser. FIGS. 8 and 9 compare the dispensing performance of an alkali-metal dispenser with a commercial chromate dispenser, a modified version of which is shown in FIG. 1.

One factor that determines the performance of a metal dispenser is its ability to not out-gas impurities when heated in a high-vacuum environment. If a metal dispenser out-gasses impurities when heated, more time is required to pump down the vacuum chamber to obtain the high-vacuum environment necessary to complete some experiments with the metal.

Referring to FIG. 8, both a chromate dispenser and an alkali-metal dispenser act as getters when not heated and absorb Carbon Monoxide (labeled "CO"), Water (labeled "H2O"), and Hydrogen (labeled "H") in a vacuum environment. When re-heated, both the chromate dispenser and an alkali-metal dispenser quickly out-gas whatever impurities have stuck to their respective surfaces or absorbed into their respective structures. The amount of impurities absorbed by the chromate dispenser or the alkali-metal dispenser when not heated can be measured by the amount of gas emitted once the chromate dispenser or the alkali-metal dispenser are re-heated.

The out-gassed impurities increase the vacuum chamber's pressure such that the impurities must be removed and the vacuum chamber's pressure reduced by the vacuum pump before additional experimentation can take place. Thus, the fewer impurities a chromate dispenser or an alkali-metal dispenser absorb when not heated, the faster a vacuum chamber can be made available for experimentation because fewer impurities have to be removed from the chamber after the dispensers are re-heated.

FIG. 8 illustrates four graphs comparing the amount of gas, Absorbed Gas, Absorbed CO, Absorbed $H_2O$, and Absorbed $H_2$, released from both a chromate dispenser and an alkali-metal dispenser (labeled "graphite" in FIG. 8) as a function of "Off Time (h)" in hours. Off Time is the number of hours the chromate dispenser and an alkali-metal dispenser remained unheated in a high-vacuum environment, which was about $10^{-8}$ Torr. The top-left graph indicates that at up to about 20 hours, both the chromate dispenser and an alkali-metal dispenser absorbed the same amount of gas. After about 20 hours of not being heated in the vacuum chamber, the chromate dispenser absorbed significantly more gas as evidenced by the amount of gas released when re-heated.

A similar divergence in the amount of impurities absorbed may be observed in the $H_2O$ graph (the lower-left graph). At some time between about 5 hours and about 20 hours, the chromate dispenser begins to absorb more $H_2O$ than the alkali-metal dispenser. At about 40 hours or more, the chromate dispenser has absorbed significantly more $H_2O$ than the alkali-metal dispenser. A similar trend may be observed in the CO and $H_2$ graphs—the longer the chromate dispenser and the alkali-metal dispenser remain unheated, the greater the divergence in the amount of impurities absorbed by the chromate dispenser than the alkali-metal dispenser.

Another factor that determines the performance of a metal dispenser is its ability to maintain or even reduce the pressure in a high-vacuum environment, at steady-state conditions, while still dispensing the alkali metal. FIG. 9 illustrates the change in chamber pressure at steady state conditions in a high-vacuum environment as a function of the amount of Rb being dispensed from a chromate dispenser and an alkali-metal dispenser. The vertical scale in each of the graphs is the percent change in total and partial pressures of the vacuum chamber after the chromate dispenser or the alkali-metal dispenser begin dispensing elemental Rb. In these plots, zero percent indicates no change in chamber pressure, negative numbers indicate a decrease in chamber pressure, and positive numbers indicate an increase in chamber pressure. Generally speaking, a lower pressure in a high-vacuum environment is more conducive to better experiments.

The horizontal scale of the graphs in FIG. 9 is listed as "A.U." for arbitrary units. It is a measure of the voltage on a photodiode observing the fluorescence of the elemental Rb in the vacuum chamber. A.U. is proportional to the amount of Rb in the chamber—the higher the A.U., the greater the fluorescence as indicated by a greater amount of Rb in the chamber.

The top-left graph in FIG. 9 compares the total fractional pressure as a function of the amount of Rb in the chamber. When dispensing elemental Rb, the chromate dispenser increases the fractional pressure in the vacuum chamber between about 8% and about 14%. In contrast, after an initial about 5% increase, the alkali-metal dispenser reduces the total and partial pressure in the vacuum chamber between about 5% and about 10% at steady-state conditions.

FIG. 9 illustrates a similar result for the total and partial pressure of $H_2O$ and CO: turning on the chromate dispenser increases the steady-state pressure of $H_2O$ and CO whereas turning on the alkali-metal dispenser reduces steady-state pressure of $H_2O$ and CO in the vacuum chamber. In contrast, the fractional pressure of $H_2$ is the same or greater using the alkali-metal dispenser as compared to the chromate dispenser.

The phenomena illustrated by the graphs in FIG. 9 may be explained by how an alkali-metal dispenser is used versus how a chromate dispenser is used. In embodiments, Rb may be dispensed from the alkali-metal dispenser at a temperature of about 140 degrees C. In contrast, the chromate dispenser requires a much higher temperature to dispense an equivalent rate of Rb. The chromate dispenser is made with rubidium-chromate deposited on a stainless-steel carrier. Thus, when heating the chromate dispenser, the stainless steel on which the chromate resides is also being heated. When heated at high temperatures, stainless steel out-gasses compounds including $H_2O$, CO, and $H_2$. Therefore, at higher dispensing temperatures, the stainless steel of the chromate dispenser out-gasses a greater quantity of these gasses and vapors. Heating the chromate dispenser to higher temperatures also has the effect of heating the surrounding vacuum chamber to higher temperatures. Because the vacuum chamber is also made of stainless steel and glass, the hotter the vacuum chamber is heated, the more its surfaces out-gas various vapors.

In embodiments, a method for dispensing elemental Rb includes providing an Rb alkali-metal dispenser, the Rb alkali-metal dispenser being within a vacuum chamber at a vacuum pressure below about $1.3 \times 10^{-5}$ Torr, and then heating the Rb alkali-metal dispenser such that the Rb alkali-metal dispenser emits the Rb at a partial pressure between about $1 \times 10^{-11}$ Torr and about $1 \times 10^{-6}$ Torr. Below about $1 \times 10^{-11}$ Torr, the Rb is difficult to detect or have it be useful in the future experiment. Above about $1 \times 10^{-6}$ Torr, the alkali-metal dispenser is dispensing the alkali metal so quickly that the dispenser will exhaust its useful alkali supply too quickly. The Rb alkali-metal dispenser is an HOPG intercalated with elemental Rb, as described above.

The Rb alkali-metal dispenser may be heated through various means. In one embodiment, the Rb alkali-metal dispenser may be directly heated with an induction coil. Thus, in other embodiments, the method for dispensing elemental Rb further includes placing an induction coil a distance proximate the Rb alkali-metal dispenser, where the induction coil is placed outside the vacuum chamber. The method further includes energizing the induction coil with a primary alternating current flow. The induction coil induces a secondary alternating current flow within the Rb alkali-metal dispenser that heats the Rb alkali-metal dispenser. Finally, the method includes adjusting the distance (between the induction coil and the Rb alkali-metal dispenser) such that the secondary alternating current flow heats the Rb alkali-metal dispenser at the desired temperature that dispenses the Rb at a desired dispensing rate.

It will be appreciated that several of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

The present invention may be embodied in other specific forms without departing from its spirit or essential characteristics. The described embodiments are to be considered in all respects only as illustrative, and not restrictive. All changes which come within the meaning and range of equivalency of the foregoing description are to be embraced within the scope of the invention.

What is claimed is:

1. A method for dispensing an elemental-alkali metal, the method comprising:

providing a highly-oriented pyrolytic graphite ("HOPG") volume intercalated with elemental rubidium ("Rb"), the HOPG volume being positioned within a vacuum chamber at a vacuum pressure below $1.3 \times 10^{-5}$ Torr;

heating the HOPG volume such that the HOPG volume emits the Rb at a partial pressure between $1 \times 10^{-11}$ and $1 \times 10^{-6}$ Torr, wherein the HOPG volume is intercalated with elemental Rb by vacuum baking the HOPG volume while the HOPB volume is positioned proximate the elemental Rb until the HOPG volume has increased in size.

2. The method of claim 1, further comprising heating the HOPG volume such that the HOPG volume emits the Rb at a partial pressure up to $1 \times 10^{-7}$ Torr.

3. The method of claim 1, further comprising heating the HOPG volume such that the HOPG volume emits the Rb at a rate greater than 1 mg/hr.

4. The method of claim 1, further comprising:
placing an induction coil a distance proximate the HOPG volume, the induction coil being positioned outside the vacuum chamber;
energizing the induction coil with a primary alternating current flow, the induction coil inducing a secondary alternating current flow within the HOPG volume to heat the HOPG volume;
and
adjusting the distance such that the secondary alternating current flow heats the HOPG volume.

5. The method of claim 1, wherein an outer most layer of the HOPG volume is free of the Rb.

6. A method for dispensing an elemental-alkali metal, the method comprising:
providing a highly-oriented pyrolytic graphite ("HOPG") volume intercalated with an elemental-alkali metal, the HOPG volume being positioned within a vacuum chamber at a vacuum pressure below $1.3 \times 10^{-5}$ Torr;
heating the HOPG volume such that the HOPG volume emits the elemental-alkali metal at a partial pressure between $1 \times 10^{-11}$ and $1 \times 10^{-6}$ Torr, wherein the HOPG volume is intercalated with elemental-alkali metal by vacuum baking the HOPG volume while the HOPB volume is positioned proximate the elemental-alkali metal until the HOPG volume has increased in size.

7. The method of claim 6, further comprising heating the HOPG volume such that the HOPG volume emits the elemental-alkali metal at a partial pressure up to $1 \times 10^{-7}$ Torr.

8. The method of claim 6, further comprising heating the HOPG volume such that the HOPG volume emits the elemental-alkali metal at a rate greater than 1 mg/hr.

9. The method of claim 6, further comprising:
placing an induction coil a distance proximate the HOPG volume, the induction coil being positioned outside the vacuum chamber;
energizing the induction coil with a primary alternating current flow, the induction coil inducing a secondary alternating current flow within the HOPG volume to heat the HOPG volume;
and
adjusting the distance such that the secondary alternating current flow heats the HOPG volume.

10. The method of claim 6, wherein an outer most layer of the HOPG volume is free of the elemental-alkali metal.

11. The method of claim 10, wherein the outer-most layer of the HOPG volume is thicker than 100 microns.

12. The method of claim 6, wherein the elemental-alkali metal is elemental rubidium ("Rb").

13. The method of claim 6, wherein vacuum-baking the HOPG volume occurs at a temperature greater than 200 degrees C., while exposed to a vacuum less than $1 \times 10^{-5}$ Torr, for a time period longer than 48 hours.

14. The method of claim 6, wherein vacuum-baking the HOPG volume while proximate the elemental-alkali metal occurs at a temperature between 125 degrees C. and 200 degrees C., while exposed to a vacuum pressure less than $1 \times 10^{-3}$ Torr.

15. The method of claim 6, further comprising vacuum-baking the HO PG-alkali metal volume in the absence of the elemental-alkali metal at a temperature greater than 140 degrees C., while exposed to a vacuum less than $1 \times 10^{-3}$ Torr, for a time period longer than 12 hours.

16. The method of claim 6, further comprising vacuum-baking the HOPG-alkali metal volume in the absence of the elemental-alkali metal until an outer-most layer of the HOPG-alkali metal volume is substantially free of the elemental-alkali metal and then packaging the HOPG-alkali metal volume in an inert-gas environment.

17. The method of claim 6, wherein the HOPG volume has a mosaic spread angle less than 1.2 degrees.

* * * * *